(12) United States Patent
Yamaguchi et al.

(10) Patent No.: US 8,823,151 B2
(45) Date of Patent: Sep. 2, 2014

(54) SEMICONDUCTOR DEVICE

(75) Inventors: Yoshihiro Yamaguchi, Tokyo (JP); Yoshiko Obiraki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/150,716

(22) Filed: Jun. 1, 2011

(65) Prior Publication Data

US 2012/0074516 A1    Mar. 29, 2012

(30) Foreign Application Priority Data

Sep. 29, 2010 (JP) ................. 2010-218256

(51) Int. Cl.
  *H01L 23/50*    (2006.01)
  *H01L 23/34*    (2006.01)
  *H01L 23/00*    (2006.01)
  *H01L 25/07*    (2006.01)
  *H01L 23/367*   (2006.01)

(52) U.S. Cl.
  CPC ..... *H01L 25/072* (2013.01); *H01L 2924/00014* (2013.01); *H01L 2224/48472* (2013.01); *H01L 2924/13055* (2013.01); *H01L 2924/10254* (2013.01); *H01L 2924/01082* (2013.01); *H01L 2224/49175* (2013.01); *H01L 2924/01005* (2013.01); *H01L 2224/73221* (2013.01); *H01L 2224/45124* (2013.01); *H01L 24/49* (2013.01); *H01L 2924/01013* (2013.01); *H01L 2924/014* (2013.01); *H01L 2924/10272* (2013.01); *H01L 23/367* (2013.01); *H01L 2224/4813* (2013.01); *H01L 24/73* (2013.01); *H01L 24/29* (2013.01); *H01L 2924/1033* (2013.01); *H01L 2924/01006* (2013.01); *H01L 2224/29139* (2013.01); *H01L 24/37* (2013.01); *H01L 2224/37012* (2013.01); *H01L 2224/40475* (2013.01); *H01L 2924/01029* (2013.01); *H01L 2224/48137* (2013.01); *H01L 2924/01068* (2013.01); *H01L 24/32* (2013.01); *H01L 2224/40137* (2013.01); *H01L 2224/73263* (2013.01); *H01L 2224/32245* (2013.01); *H01L 2924/01047* (2013.01); *H01L 2924/1203* (2013.01); *H01L 2924/01033* (2013.01)
  USPC ............ 257/673; 257/669; 257/713; 257/724

(58) Field of Classification Search
  None
  See application file for complete search history.

(56) References Cited

U.S. PATENT DOCUMENTS 6,078,514 A    6/2000  Takemae et al.
7,589,400 B2 *  9/2009  Hozoji et al. ................. 257/673

(Continued)

FOREIGN PATENT DOCUMENTS

CN    1758522 A    4/2006
DE    101 56 626 A1    6/2003

(Continued)

OTHER PUBLICATIONS

German Office Action issued Jan. 17, 2013 in Patent Application No. 10 2011 082 781.1 with English Translation.

(Continued)

*Primary Examiner* — Matthew W Such
*Assistant Examiner* — Scott Stowe
(74) *Attorney, Agent, or Firm* — Oblon, Spivak, McClelland, Maier & Neustadt, L.L.P.

(57) ABSTRACT

An object is to provide a semiconductor device having a plate electrode adapted to a plurality of chips, capable of being produced at low cost, and having high heat cycle property. A semiconductor device according to the present invention includes a plurality of semiconductor chips formed on a substrate, and a plate electrode connecting electrodes of the plurality of semiconductor chips. The plate electrode has half-cut portions formed by half-pressing and the raised sides of the half-cut portions are bonded with the electrodes of the semiconductor chips.

7 Claims, 8 Drawing Sheets

(56) References Cited

U.S. PATENT DOCUMENTS

| | | | |
|---|---|---|---|
| 2004/0012064 A1* | 1/2004 | Yoshizaki et al. | 257/448 |
| 2004/0188706 A1* | 9/2004 | Chang et al. | 257/177 |
| 2006/0268524 A1 | 11/2006 | Uehara et al. | |
| 2007/0114577 A1 | 5/2007 | Narazaki | |
| 2008/0012045 A1 | 1/2008 | Muto et al. | |
| 2010/0078803 A1 | 4/2010 | Andou et al. | |
| 2010/0089607 A1 | 4/2010 | Nakamura et al. | |

FOREIGN PATENT DOCUMENTS

| | | |
|---|---|---|
| DE | 10 2006 051 454 A1 | 9/2007 |
| DE | 10 2007 039 916 A1 | 2/2009 |
| JP | 11-86546 | 3/1999 |
| JP | 2000-277557 | 10/2000 |
| JP | 2001-156219 | 6/2001 |
| JP | 2002-217364 | 8/2002 |
| JP | 2007-142138 | 6/2007 |
| JP | 2008-21796 | 1/2008 |

OTHER PUBLICATIONS

Japanese Office Action issued Jul. 30, 2013, in Japan Patent Application No. 2010-218256 (with Partial English translation).

Chinese Office Action issued Nov. 27, 2013 in Chinese Application No. 2011/10198380.0 with English Translation.

* cited by examiner

F I G. 3 A
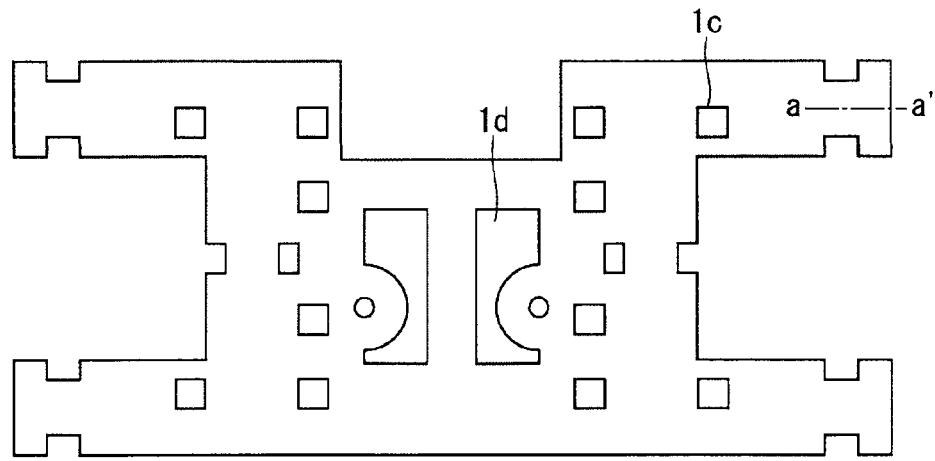
F I G. 3 B
F I G. 4 A
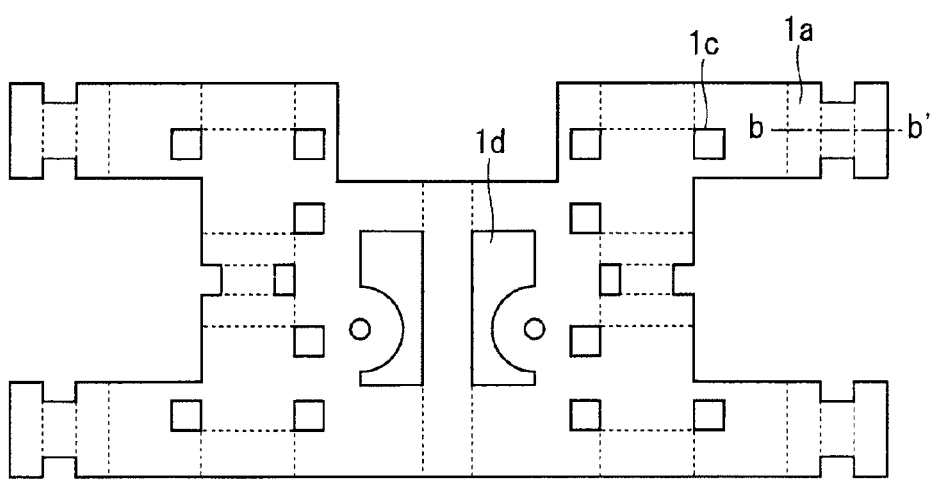
F I G. 4 B
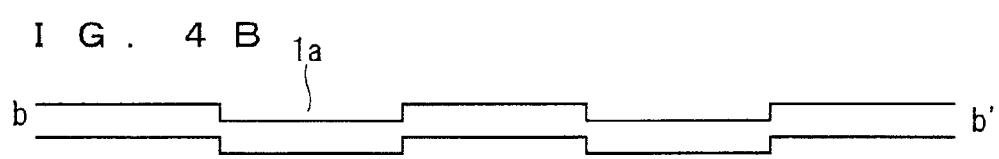

SEMICONDUCTOR DEVICE

BACKGROUND OF THE INVENTION

1. Field of the Invention

The present invention relates to a connecting technique for a semiconductor device in which a plurality of semiconductor chips, such as power semiconductor devices, are provided on a substrate.

2. Description of the Background Art

In such a semiconductor device, a metal heat spread is provided over a metal base plate with an insulating layer therebetween, and semiconductor chips such as IGBTs and diodes are bonded on the heat spread with solder. Methods for connecting such a plurality of semiconductor chips include wire bonding in which connections are made with wires like aluminum wires (see Japanese Patent Application Laid-Open No. 11-086546 (1999)) and direct lead bonding in which a lead frame is directly connected to the semiconductor chips (DLB; see Japanese Patent Application Laid-Open No. 2007-142138).

For wire bonding, the number of wires increases when an increased number of chips are provided on the substrate, and then the productivity is lowered.

For DLB, the resistance and inductance components are reduced as compared with wire bonding, and it has the advantage of high heat cycle property. However, when connections are made with a plurality of chips, the solder thicknesses in bonded portions vary and then the heat cycle property is lowered. Also, complicated bending processing is necessary in order to adapt to a plurality of chips. This increases the number of molding process steps with molds and increases manufacturing costs.

At present, semiconductor devices using materials capable of high-temperature operations, typically SiC, are under development, and structures stably connecting a plurality of chips at high temperatures are demanded.

SUMMARY OF THE INVENTION

An object of the present invention is to provide a semiconductor device having a plate electrode adapted to a plurality of chips, capable of being produced at low cost, and having high heat cycle property.

A semiconductor device according to the present invention includes a plurality of semiconductor chips and a plate electrode. The plurality of semiconductor chips are formed on a substrate. The plate electrode is full-cut into a given pattern for connecting electrodes of the plurality of semiconductor chips, and has half-cut portions formed by half-pressing. Raised sides of the half-cut portions are bonded with the electrodes of the semiconductor chips.

The plate electrode has half-cut portions formed by half-pressing and the raised sides of the half-cut portions are bonded with the electrodes of semiconductor chips. Accordingly, complicated bending processing is not necessary in order to make a complicated configuration adapted to semiconductor chips, and so it can be made at low cost with a less number of molds. Also, the number of process steps does not increase even when the number of chips is increased, and so it can be made at low cost from the aspect of reducing the number of process steps.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 3A and 3B are a plan view and a cross-sectional view illustrating the process of producing the plate electrode of the present invention;

FIGS. 4A and 4B are a plan view and a cross-sectional view illustrating the process of producing the plate electrode of the present invention;

DESCRIPTION OF THE PREFERRED EMBODIMENTS (Preliminary Techniques)

Figure 11A:
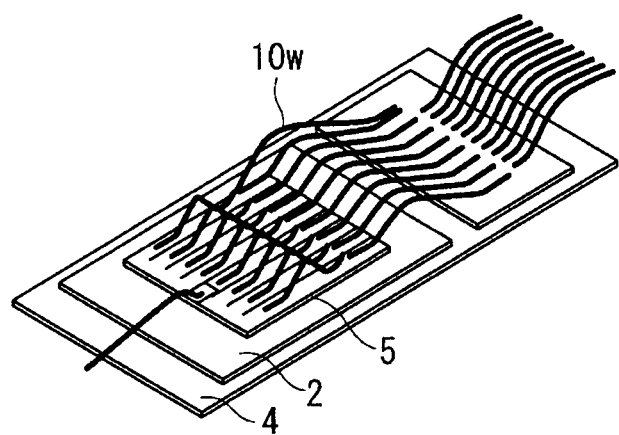
FIGS. 11A and 11B are perspective views illustrating connecting structures of semiconductor chips according to preliminary techniques.
Figure 11B:
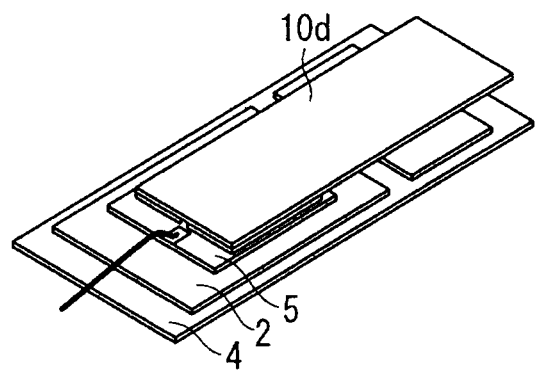

FIGS. 11A and 11B are diagrams illustrating semiconductor chip connecting structures according to preliminary techniques of the present invention, where FIG. 11A shows wire bonding and FIG. 11B shows DLB.

In FIGS. 11A and 11B, a metal heat spreader 2 is provided on an insulating layer 4, and semiconductor chips 5 are provided on the heat spreader 2. According to the wire bonding shown in FIG. 11A, individual semiconductor chips 5 are connected with wires 10w, e.g. aluminum wires. Accordingly, the number of wires increases as the number of chips increases, and the cost increases.

In the DLB shown in FIG. 11B, a lead frame 10d is directly connected to semiconductor chips 5. When the lead frame 10d is connected to a plurality of semiconductor chips 5, the solder thicknesses at bonded portions vary and the heat cycle property is lowered. Also, complicated bending processing is needed in order to adapt the lead frame 10d to a plurality of semiconductor chips 5. This increases the number of molding process steps with molds and increases manufacturing costs.

Accordingly, the present invention provides a low-cost plate electrode connecting a plurality of semiconductor chips 5 by forming a pattern by full-cutting and half-pressing a single plate.

First Preferred Embodiment

<Structure>

Figure 1:
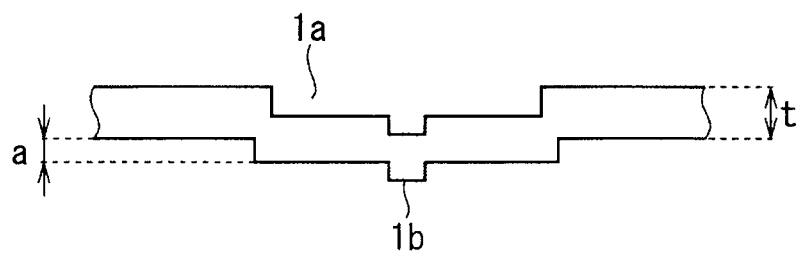
FIG. 1 is a cross-sectional view illustrating a plate electrode of the present invention.

FIG. 1 is a cross-sectional view illustrating a plate electrode of the present invention used to connect a plurality of semiconductor chips. The plate electrode 1 having a thickness t includes a half-cut portion 1a half-pressed with a thickness a and an embossed portion 1b in the half-cut portion 1a. As will be described later, the plate electrode 1 is punched (full-cut) into a given pattern. The material of the plate electrode 1 can be low-resistant Cu or Al.

Figure 6:
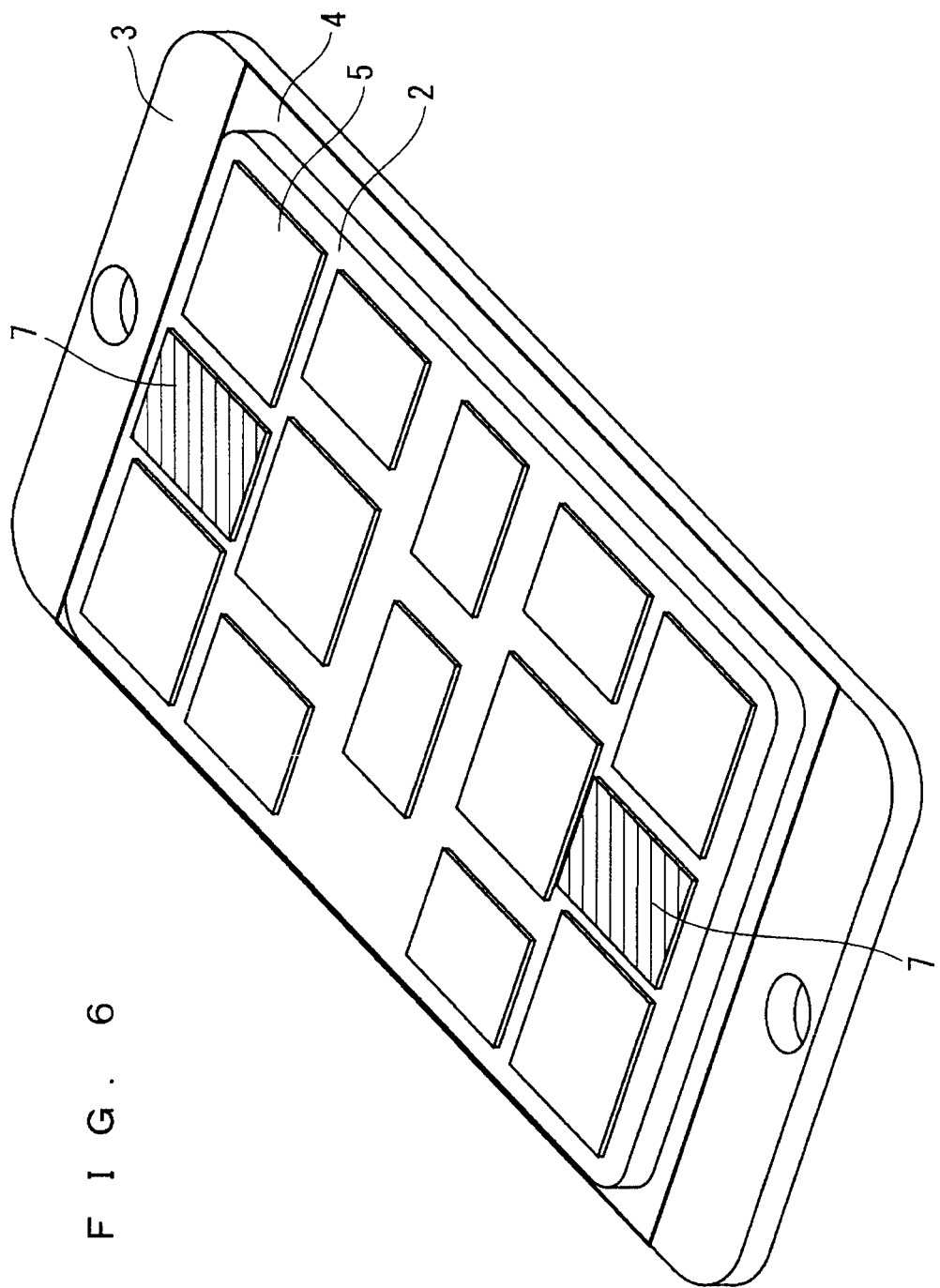
FIG. 6 is a perspective view illustrating a semiconductor device to which the plate electrode of the present invention is applied.

FIG. 6 is a perspective view of a semiconductor device to which the plate electrode 1 is applied. In the semiconductor device shown in FIG. 6, a metal heat spreader 2 is provided over a metal base plate 3 with an insulating layer 4 therebetween, and a plurality of semiconductor chips, such as IGBT chips and diode chips, are provided on the heat spreader 2. Controlling drive substrates 7 for IGBT gate driving are also provided on the heat spreader 2. Though not shown in the diagram, the controlling drive substrates 7 are connected to a printed board through emitter relay terminals and gate relay terminals, and the controlling drive substrates 7 can be controlled with external signals.

Figure 7:
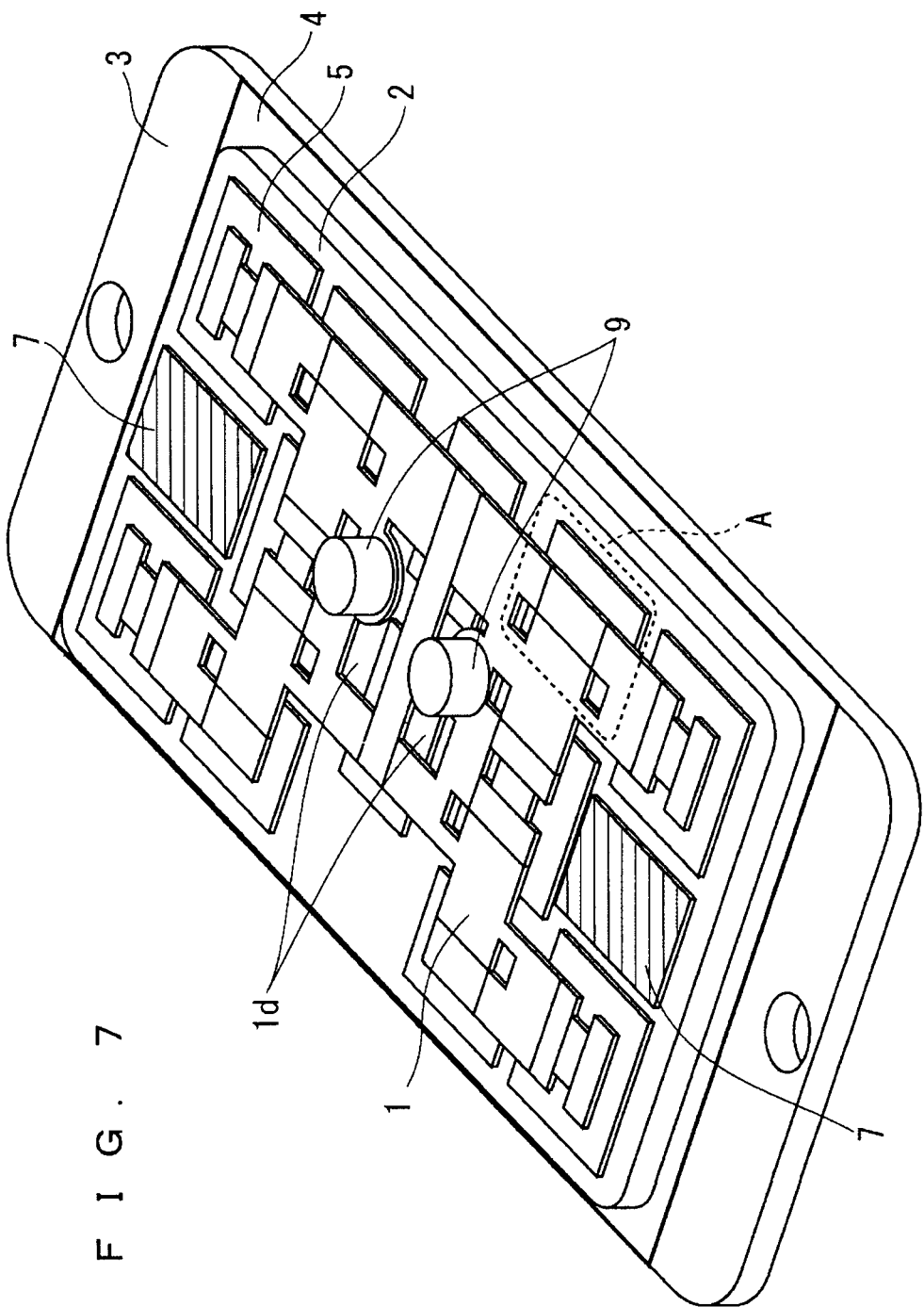
FIG. 7 is a perspective view illustrating the semiconductor device and the plate electrode of the present invention applied thereto.

FIG. 7 is a perspective view in which the semiconductor chips 5 of the semiconductor device shown in FIG. 6 are connected with the plate electrode 1 shown in FIG. 1. As the plate electrode 1 is provided close to the heat spreader 2, the opposite direction currents flowing in the two conductors cancel mutual magnetic fluxes, and parasitic inductance is reduced as compared with wire bonding.

Figure 8:
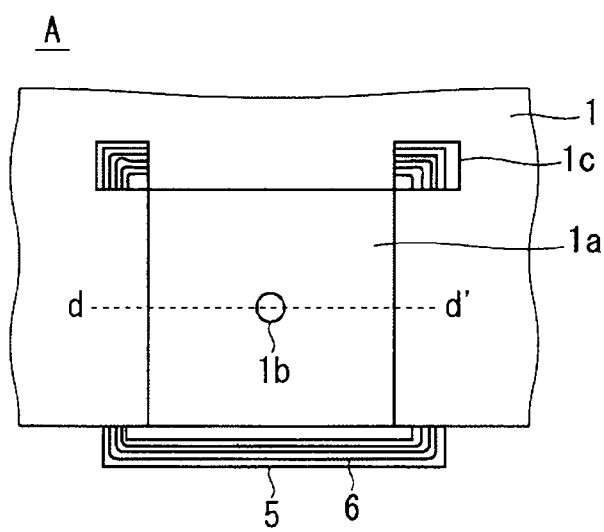
FIG. 8 is an enlarged view of an important portion in FIG. 7 illustrating the plate electrode and a semiconductor chip of the present invention.
Figure 9:
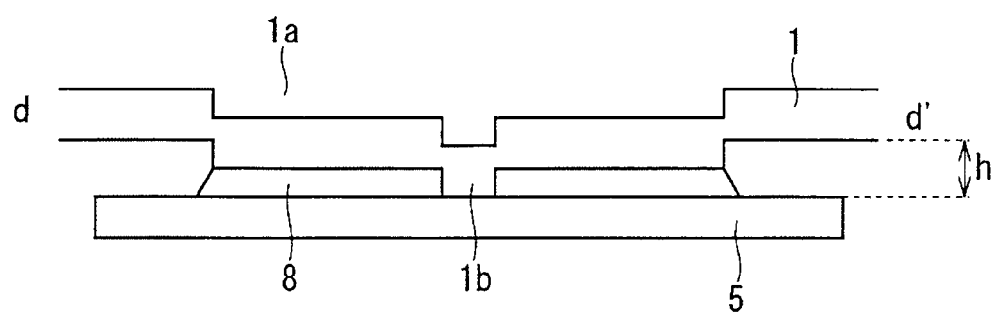
FIG. 9 is a cross-sectional view illustrating the plate electrode and a semiconductor chip of the present invention.

FIG. 9 is a cross-sectional view illustrating the plate electrode 1 bonded to a semiconductor chip 5, which is also a d-d' cross-sectional view of FIG. 8 that is an enlarged view of the portion A in FIG. 7. The half-cut portion 1a of the plate electrode 1 is bonded to the semiconductor chip 5 with a bonding material 8 like solder or silver therebetween. Now, the plate electrode 1 has an embossed portion 1b projecting from the raised side of the half-cut portion 1a, and the thickness of the bonding material 8 is ensured for the height of the embossed portion 1b as the embossed portion 1b abuts on the semiconductor chip 5. Accordingly, when the plate electrode 1 connects a plurality of semiconductor chips 5, the thickness of the bonding material 8 can be uniform in bonded portions, and the heat cycle property is improved.

Figure 10:
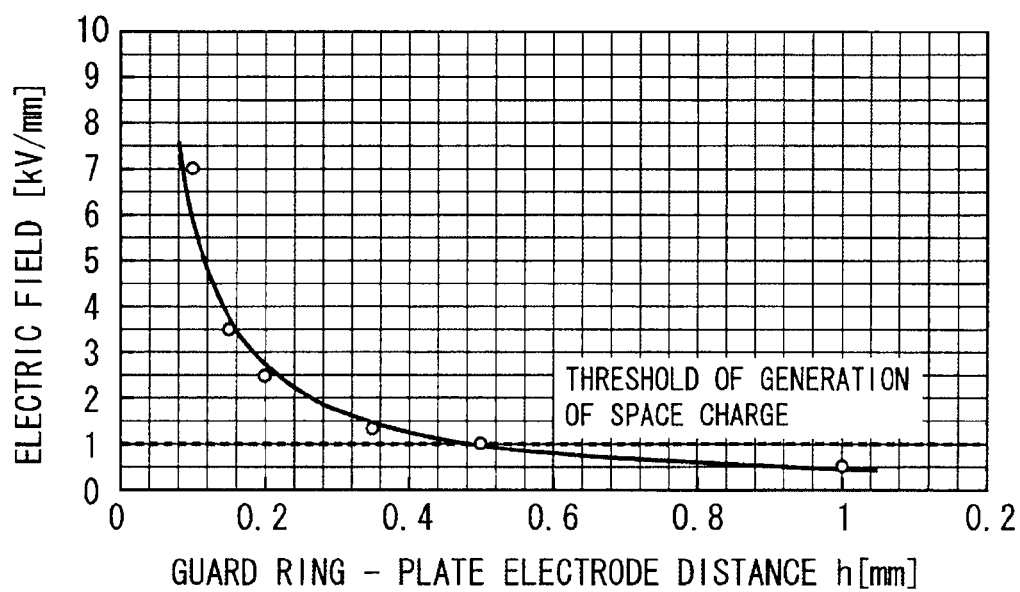
FIG. 10 is a diagram illustrating the relation between the guard ring—plate electrode distance and the electric field at the surface of the guard ring.

FIG. 8 is an enlarged view of the portion A in FIG. 7. An electric field occurs in the periphery of the semiconductor chip 5 in correspondence with the voltage that the semiconductor device controls. When the periphery of the semiconductor chip 5 and the upper plate electrode 1 are close, electrons are injected from the plate electrode 1 and space charge is formed in the sealing material. When the space charge stays in the vicinity of the guard ring 6 provided in the periphery of the semiconductor chip 5, the electric field at the surface of the guard ring 6 increases and the electric field in the semiconductor chip also increases, and then the leakage current increases. FIG. 10 shows the relation between the distance between the guard ring 6 and the plate electrode 1 (h shown in FIG. 9) and the electric field at the surface of the guard ring 6. FIG. 10 shows that the electric field at the surface of the guard ring 6 becomes higher as h becomes smaller. As the electric field threshold at the surface of the guard ring 6 at which space charge occurs is 1 kV/mm, the leakage current is suppressed by setting h at 0.6 mm or more.

Also, at corners of the guard ring 6 having a smaller curvature, the electric field is higher than at straight portions. Accordingly, as shown in FIG. 8, the plate electrode 1 is removed above the corners of the guard ring 6, whereby the electric field at the corners of the guard ring 6 can be suppressed and leakage current can be further suppressed.

As shown in FIG. 7, electrode posts 9 are provided on the plate electrode 1 in portions not located above semiconductor chips 5. Emitter electrodes are bonded to the electrode posts 9 and externally connected. In the process of transfer molding, the upper surfaces of the electrode posts 9 come in contact with the mold. Now, there is no semiconductor chip 5 under the electrode posts 9, so that the upper surfaces of the electrode posts 9 are kept parallel to the base plate 3 due to the bend effect of the plate electrode 1. Also, the upper surfaces of the electrode posts 9 are kept parallel also to the bonded emitter electrodes. Thus, the solder thickness is uniform when the electrode posts 9 and the emitter electrodes are bonded with solder, and so heat cycle property is ensured. Also, when ultrasonic (US) bonding is used in which the bonded portion is processed with ultrasonic waves while being pressed with high pressure, uniform pressure can be applied to the bonded surface.

Also, the emitter electrodes connected to the electrode posts 9 are connected to a laminate bus bar together with an emitter electrode of another semiconductor device forming a control system. Laminate bus bars have heat-resistant temperature restrictions, and usually temperatures of 105° C. or less are recommended. Accordingly, as shown in FIG. 7, the plate electrode 1 around the electrode posts 9 is removed to form slits 1d, whereby the heat resistance from the semiconductor chips 5 to the electrode posts 9 is enlarged so that the temperature of the emitter electrodes as an external electrode connected to the electrode posts 9 stays in an appropriate range.

For semiconductor chips 5 such as IGBTs and diodes, wide band gap semiconductors such as SiC having wider band gap than Si may be used. Wide band gap semiconductors include GaN material and diamond as well as SiC. The plate electrode 1 of the present invention has high heat cycle property, so that it can be stably used in semiconductor devices provided with high-temperature-operable semiconductor chips 5 mentioned above.

<Producing Process>

FIGS. 2 to 5B are cross-sectional views and plan views illustrating a process of producing the plate electrode 1. The process of producing the plate electrode 1 will be described referring to FIGS. 2 to 5B.

Figure 2:
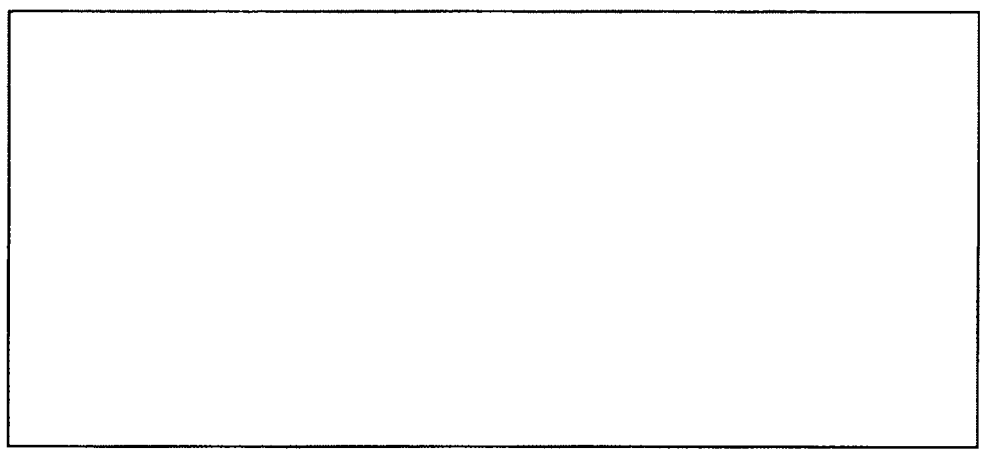
FIG. 2 is a plan view illustrating a process of producing the plate electrode of the present invention.

First, a single plate to be the plate electrode 1 shown in FIG. 2 is punched to a shape adapted to a plurality of semiconductor chips (FIG. 3A). In this step, the blanks 1c and slits 1d, described later, are formed in the plate electrode 1. FIG. 3B is a cross-sectional view taken along a-a' of FIG. 3A.

Next, the plate electrode 1 is half-pressed to form half-cut portions 1a in parts of the plate electrode 1 (FIGS. 4A and 4B). As shown in FIG. 4B as a b-b' section of FIG. 4A, raised portions of the half-cut portions 1a are formed on the back of the plate electrode 1, and these portions are bonded with semiconductor chips with a bonding material like solder. The height a of the raised portions of the half-cut portions 1a is not more than a half of the thickness t of the plate electrode 1 (a≤t/2), whereby the formation is facilitated with high dimensional accuracy, allowing the plate electrode 1 to be easily formed in a large area.

Figure 5A:
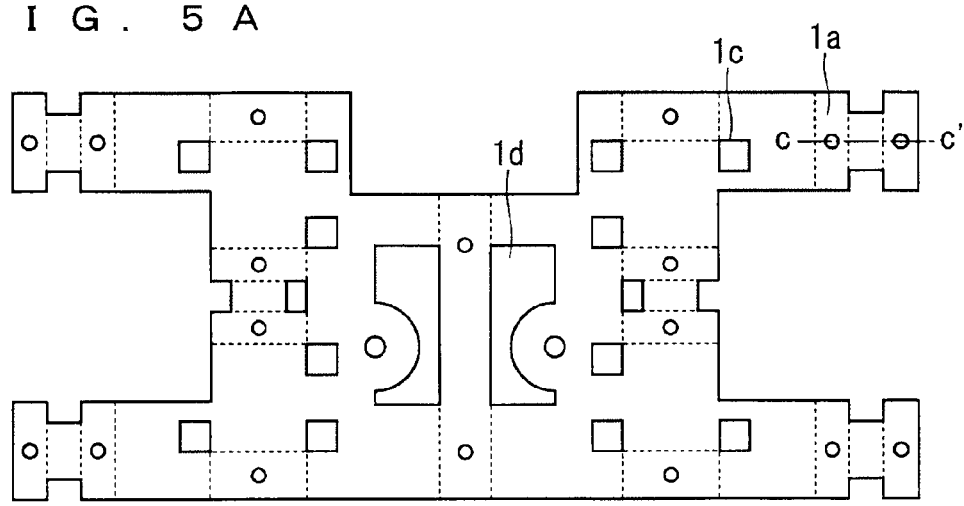
FIGS. 5A and 5B are a plan view and a cross-sectional view illustrating the process of producing the plate electrode of the present invention.
Figure 5B:
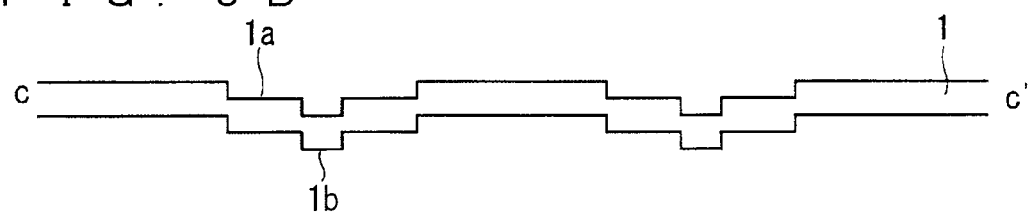

Furthermore, embossing processing is applied to the half-cut portions 1a, to form dot-like embossed portions 1b (FIGS. 5A and 5B). As shown in FIG. 5B that is the c-c' section of FIG. 5A, the embossed portions 1b project from the raised portions of the half-cut portions 1a.

As described so far, the plate electrode 1 of the present invention does not require complicated bending processing to adapt to a plurality of semiconductor chips, so that it can be formed with a less number of molds and at low cost. Also, unlike wire bonding, the number of process steps does not increase even when the number of chips increases, so that it is at low cost also from the aspect of reducing the number of process steps. Thus, the semiconductor device provided with the plate electrode 1 of the present invention can be manufactured at low cost.

<Effects>

A semiconductor device of the present invention includes a plurality of semiconductor chips 5 formed on a substrate and a plate electrode 1 that is full-cut into a given pattern connecting electrodes of the plurality of semiconductor chips 5, and the plate electrode 1 has half-pressed, half-cut portions 1a, and the raised sides of the half-cut portions 1a are bonded with the electrodes of the semiconductor chips 5, whereby a semiconductor device having a connecting structure adapted to a plurality of semiconductor chips can be manufactured at low cost.

Also, in the semiconductor device of the present invention, the plate electrode 1 further has embossed portions 1b that are formed by embossing processing in the half-cut portions 1a to project from the raised sides of the half-cut portions 1a. The embossed portions 1b abut on the semiconductor chips 5 and the thickness of the bonding material 8 is ensured for the height of the embossed portions 1b. Accordingly, when a plurality of semiconductor chips 5 are connected through the plate electrode 1, the thickness of the bonding material 8 can be uniform in bonded portions, and the heat cycle property is improved.

Also, in the semiconductor device of the present invention, a semiconductor chip 5 has a guard ring 6 around its periphery, and the interval between the portion out of the half-cut portion 1a of the plate electrode 1 and the guard ring 6 of the semiconductor chip 5 is not less than 0.6 mm, whereby the electric field at the surface of the guard ring 6 is suppressed and leakage current is suppressed.

Also, in the semiconductor device of the present invention, regions of the plate electrode 1 corresponding to corners of the guard ring 6 of the semiconductor chip 5 are removed, whereby the electric fields at the corners where the electric fields most concentrate are alleviated and leakage current is suppressed.

Also, in the semiconductor device of the present invention, the height of the raised portions of the half-cut portions 1a is not more than a half of the thickness of the plate electrode 1, whereby the formation is facilitated with high dimensional accuracy, allowing the plate electrode 1 to be easily formed in a large area.

Also, the semiconductor device of the present invention includes an electrode post 9 provided on the plate electrode 1 in a region where no semiconductor chip 5 exists underneath, and an external electrode connected to the electrode post 9. Accordingly, in the transfer mold process, the upper surface of the electrode post 9 is kept parallel also to the external electrode due to the bend effect of the plate electrode 1, whereby the solder thickness at the bonded surface between the electrode post 9 and the external electrode is uniform and heat cycle property is ensured. Also, when ultrasonic (US) bonding is used, a uniform pressure can be applied to the bonded surface.

Also, in the semiconductor device of the present invention, at least part of the plate electrode 1 located around the electrode post 9 is removed, whereby the heat resistance from the semiconductor chips 5 to the electrode post 9 is large, and the temperature of the external electrode connected to the electrode post 9 can be within a proper range.

Also, in the semiconductor device of the present invention, when high-temperature operating semiconductor chips 5 are provided by forming the semiconductor chips 5 with a wide band gap semiconductor, the heat cycle property of the plate electrode 1 is not lowered and the insulating performance of the semiconductor chips 5 can be enhanced.

While the invention has been described in detail, the foregoing description is in all aspects illustrative and not restrictive. It is understood that numerous other modifications and variations can be devised without departing from the scope of the invention.

What is claimed is:

1. A semiconductor device comprising:
   a plurality of semiconductor chips formed on a substrate; and
   a plate electrode full-cut into a given pattern for connecting electrodes of said plurality of semiconductor chips,
   said plate electrode having half-cut portions, the half-cut portions being formed by half-pressing and exhibiting raised sides, wherein the raised sides of said half-cut portions are bonded by bonding material with said electrodes of said semiconductor chips,
   wherein said plate electrode further has embossed portions that are formed in said half-cut portions by embossing processing to project from said raised sides of said half-cut portions,
   wherein the embossed portions abut on the semiconductor chips, and wherein the thickness of the bonding material corresponds to the height of the embossed portions from said raised sides of said half-cut portions.

2. The semiconductor device according to claim 1, further comprising an electrode post provided on a region of said plate electrode where no said semiconductor chip exists underneath, and
   an external electrode connected to said electrode post.

3. The semiconductor device according to claim 2, wherein at least part of said plate electrode located around said electrode post is removed.

4. The semiconductor device according to claim 1, wherein said semiconductor chips are made of a wide band gap semiconductor.

5. A semiconductor device comprising:
   a plurality of semiconductor chips formed on a substrate; and
   a plate electrode full-cut into a given pattern for connecting electrodes of said plurality of semiconductor chips,
   said plate electrode having half-cut portions formed by half-pressing, raised sides of said half-cut portions being bonded with said electrodes of said semiconductor chips,
   wherein said semiconductor chips have guard rings in peripheries, and
   an interval between parts out of said half-cut portions of said plate electrode and said guard rings of said semiconductor chips is not less than 0.6 mm.

6. The semiconductor device according to claim 5, wherein said plate electrode is removed in regions corresponding to corners of said guard rings of said semiconductor chips.

7. A semiconductor device comprising:
   a plurality of semiconductor chips formed on a substrate; and
   a plate electrode full-cut into a given pattern for connecting electrodes of said plurality of semiconductor chips,
   said plate electrode having half-cut portions formed by half-pressing, raised sides of said half-cut portions being bonded with said electrodes of said semiconductor chips, wherein a height of the raised sides of said half-cut portions is not more than a half of a thickness of said plate electrode.

* * * * *